United States Patent [19]

Sugai

[11] 4,087,641

[45] May 2, 1978

[54] NOISE LIMITING CIRCUIT FOR FM STEREO RECEIVER

[75] Inventor: Yoshiro Sugai, Kawagoe, Japan

[73] Assignee: Pioneer Electronic Corporation, Tokyo, Japan

[21] Appl. No.: 782,581

[22] Filed: Mar. 29, 1977

[30] Foreign Application Priority Data

Apr. 1, 1976 Japan .......................... 51-39625[U]
Jul. 14, 1976 Japan .......................... 51-93630[U]

[51] Int. Cl.² .............................................. H04H 5/00
[52] U.S. Cl. .............................. 179/15 BT; 325/319; 325/348; 325/457; 325/477; 325/480
[58] Field of Search ............... 179/15 BT, 1 G, 1 P; 325/348, 402, 403, 313, 315, 319, 473, 477, 478, 480, 482, 312, 456, 457, 36

[56] References Cited

U.S. PATENT DOCUMENTS

| 3,569,633 | 3/1971 | Brahman | 325/456 |
| 3,707,603 | 12/1972 | Limberg | 179/15 BT |
| 3,790,714 | 2/1974 | Ohsawa | 179/15 BT |

FOREIGN PATENT DOCUMENTS

| 1,266,815 | 4/1968 | Germany | 179/15 BT |
| 2,322,417 | 11/1974 | Germany | 179/15 BT |

*Primary Examiner*—Howard W. Britton
*Assistant Examiner*—Marc E. Bookbinder
*Attorney, Agent, or Firm*—Sughrue, Rothwell, Mion, Zinn and Macpeak

[57] ABSTRACT

A noise limiting circuit for an FM stereo receiver comprises a filter circuit 13 for grounding high frequency components in the detector output signal through a transistor switch 14 in response to a low field strength signal supplied by the IF amplifier. The filter circuit, when activated, also grounds the 19 KHz pilot signal to automatically switch from a stereo to monaural mode, which further improves the S/N ratio. The pilot signal grounding effect may be enhanced by including an inductor in the filter circuit which, in combination with the filter capacitor, is tuned to the pilot signal frequency. The transistor 14 is switched in a rapid on — slow off mode by providing a storage capacitor 20 and discharge resistors 17, 19 in the base control circuit of the transistor, and the filter switching or squelch level may be adjusted by a variable resistor 22.

8 Claims, 3 Drawing Figures

NOISE LIMITING CIRCUIT FOR FM STEREO RECEIVER

BACKGROUND OF THE INVENTION

The present invention relates to an improved noise limiting circuit for an FM stereo receiver operable to automatically suppress high frequency noise components and switch from a stereo to monaural mode in response to a weak electric reception field.

It is well known that high frequency noise becomes noticeable in the demodulated signal in an FM receiver when the received signal strength becomes weak. Accordingly, the S/N (Signal-to-Noise) ratio can be considerably improved by cutting off or squelching the high frequency components of the demodulated signal in response to the lowering of the received signal strength. The S/N ratio can be further improved by automatically switching from the stereophonic reception mode to the monaural reception mode in response to such signal weakening. Although receivers which implement such cutoff and changeover are well known, they involve frequent switching operations when the received signal strength fluctuates around the switching threshold level, and such a phenomenon is particularly noticeable in a moving car radio. Consequently, noise due to the switching operations is produced, which disrupts the quality of the sound reproduction.

SUMMARY OF THE INVENTION

To overcome the above disadvantages, the present invention provides a noise limiting circuit for an FM stereo receiver wherein a stereophonic reception is forcibly switched to the monaural mode in response to the lowering of the received signal strength, and wherein the high frequency components of the demodulated signal are simultaneously cutoff or grounded. The switching from the stereo to the monaural mode is rapid, but the reverse switching back into the stereo mode is accomplished with a time delay determined by a time constant circuit in order to eliminate noise produced by frequent and unnecessary switching operations.

DETAILED DESCRIPTION OF THE PREFERRED EMBODIMENTS

Figure 1:
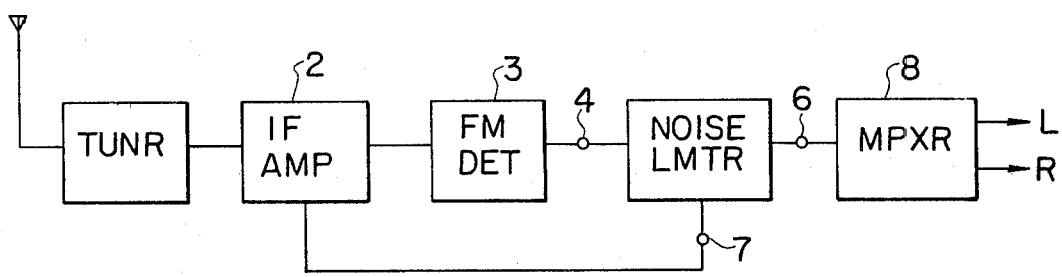
FIG. 1 shows a block diagram of an FM stereo receiver according to the present invention.
Figure 2:
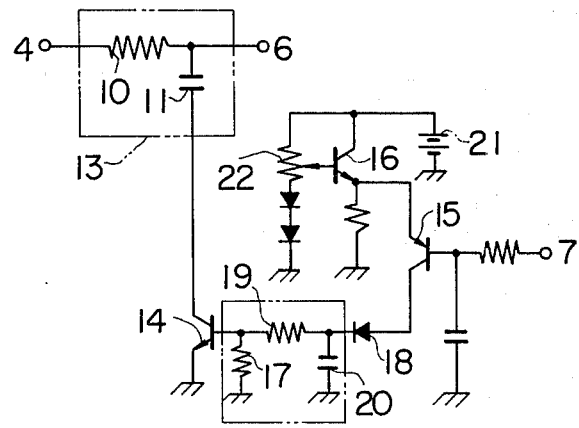
FIG. 2 shows a schematic diagram of a noise limiting circuit for an FM stereo receiver according to the invention.

Referring to FIGS. 1 and 2, a high frequency cutoff filter 13 comprises a resistor 10 and a capacitor 11, the input terminal 4 being connected to the output of an FM detector 3 and the output terminal 6 being connected to a multiplex circuit 8. The capacitor 11 is connected to the collector of transistor 14 in a switching circuit, which further includes transistors 15 and 16. The emitter of transistor 14 is grounded and the base thereof is connected to a grounded resistor 17 and to a series resistor 19 connected to a grounded capacitor 20 and to the cathode of a diode 18. The collector of transistor 15 is connected to the anode of diode 18 and the base thereof is connected to an IF (Intermediate Frequency) amplifier stage 2 at terminal 7. The collector of transistor 16 is connected to a d.c. power source 21 and to one terminal of a variable resistor 22 grounded through a pair of series diodes. The emitter of transistor 16 is coupled to the emitter of transistor 15, and the movable terminal of variable resistor 22 is connected to the base of transistor 16.

In operation, the detected IF signal is applied to the base of transistor 15 through terminal 7, its magnitude being proportional to the strength of the received FM signal. Transistor 16 supplies a constant voltage to the emitter of transistor 15, whereby transistor 15 is switched on and off in response to the magnitude of the detected IF signal, i.e., the received signal strength. The conduction threshold of transistor 15 may be set at a desired level by variable resistor 22. When the received signal strength is above a predetermined level, transistor 15 turns off and the charge stored in capacitor 20 discharges through resistors 19 and 17, and to a minor extent through the base and emitter of transistor 14. When the charge on capacitor 20 falls below a predetermined level, after a relatively long delay determined by the time constant of the circuit, transistor 14 turns off, thereby disabling the operation of the filter 13.

On the other hand, when the received signal strength falls below the present threshold level, transistor 15 turns on and its collector current rapidly charges capacitor 20 and turns on transistor 14, thereby enabling the high frequency cutoff filter 13. The 19 KHz pilot signal in the detector output (assuming that a stereo signal is present) is also attenuated or grounded and thus does not reach the multiplex circuit 8, whereby the receiver output automatically switches to the monaural mode.

Figure 3:
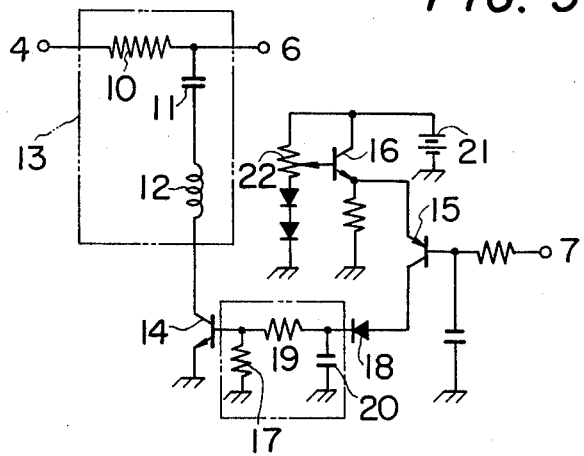
FIG. 3 shows a schematic diagram of a modified embodiment of FIG. 2.

The circuit embodiment of FIG. 3 is the same as that of FIG. 2 except that a coil 12 is connected in series between the capacitor 11 and the collector of transistor 14. This coil and capacitor combination constitutes a trap circuit tuned to the frequency of the pilot signal, whereby a dip is provided in the filter response curve at 19 KHz. The pilot signal is therefore heavily attenuated when the filter 13 is operative, the level of such attenuation being around −20dB.

As will be apparent from the foregoing description, in the FM stereo receiver according to the present invention the S/N ratio is greatly improved by automatically switching from a stereo to monaural mode and simultaneously cutting off or grounding the high frequency signal components in response to a low or weak signal strength. This noise limiting circuit is especially effective to suppress ignition noises.

Further, the termination of the filter operation is implemented with a time delay to thereby avoid frequent on-off switching due to small changes in the received signal strength in the area of the threshold level.

What is claimed is:

1. A noise limiting circuit for an FM stereo receiver including, in series, a tuner circuit, an intermediate frequency (IF) amplifier circuit, an FM detector or demodulator circuit, and a multiplexing circuit, comprising:
    (a) a filter circuit for passing high frequency signal components connected between the detector circuit and the multiplexing circuit.
    (b) a transistor switch for coupling the output of the filter circuit to ground.
    (c) threshold switching means responsive to an output from the IF amplifier circuit, and (d) time delay means connected between the output of the threshold switching means and the transistor switch for rapidly turning the latter on in response to an output from the threshold switching means and for delaying the turn-off of the transistor switch, whereby the switching means renders the transistor switch rapidly conductive when the IF amplifier circuit output falls below the threshold level to thereby ground high frequency signal components and any pilot signal appearing in the detector circuit output, whereby the receiver output transfers from a stereo to a monaural mode, and wherein the time delay means delays the turn-off of the transistor switching when the IF amplifier circuit output rises above the threshold level.

2. A noise limiting circuit as defined in claim 1, wherein the filter circuit comprises a capacitor and an inductor connected in series and having a resonant frequency of approximately 19 KHz.

3. A noise limiting circuit as defined in claim 1, wherein the threshold switching means comprises a variable constant voltage source and a switching transistor, the constant voltage source being connected to the emitter of the switching transistor and the IF amplifier circuit output being connected to the base thereof.

4. A noise limiting circuit as defined in claim 2, wherein the threshold switching means comprises a variable constant voltage source and a switching transistor, the constant voltage source being connected to the emitter of the switching transistor and the IF amplifier circuit output being connected to the base thereof.

5. A noise limiting circuit as defined in claim 1, wherein the time delay means comprises a charging capacitor connected between the base circuit of the transistor switch and ground, and a capacitor discharge resistor connected between the base circuit of the transistor switch and ground.

6. A noise limiting circuit as defined in claim 2, wherein the time delay means comprises a charging capacitor connected between the base circuit of the transistor switch and ground, and a capacitor discharge resistor connected between the base circuit of the transistor switch and ground.

7. A noise limiting circuit as defined in claim 3, wherein the time delay means comprises a charging capacitor connected between the base circuit of the transistor switch and ground, and a capacitor discharge resistor connected between the base circuit of the transistor switch and ground.

8. A noise limiting circuit as defined in claim 4, wherein the time delay means comprises a charging capacitor connected between the base circuit of the transistor switch and ground, and a capacitor discharge resistor connected between the base circuit of the transistor switch and ground.

* * * * *